(12) United States Patent
Kwon et al.

(10) Patent No.: US 8,384,271 B2
(45) Date of Patent: Feb. 26, 2013

(54) ELECTROACTIVE POLYMER ACTUATOR AND METHOD OF MANUFACTURING THE SAME

(75) Inventors: Jong-Oh Kwon, Suwon-si (KR); Seung-Tae Choi, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 151 days.

(21) Appl. No.: 12/855,785

(22) Filed: Aug. 13, 2010

(65) Prior Publication Data

US 2011/0116171 A1 May 19, 2011

(30) Foreign Application Priority Data

Nov. 16, 2009 (KR) .................. 10-2009-0110503

(51) Int. Cl.
*H01L 41/047* (2006.01)

(52) U.S. Cl. ....................................... 310/328; 310/366

(58) Field of Classification Search .................. 310/328, 310/366

See application file for complete search history.

(56) References Cited

U.S. PATENT DOCUMENTS

| | | | |
|---|---|---|---|
| 5,568,679 A | 10/1996 | Ohya et al. | |
| 5,607,535 A | 3/1997 | Tsukada et al. | |
| 5,883,682 A * | 3/1999 | Kim et al. | 349/43 |
| 6,343,129 B1 | 1/2002 | Pelrine et al. | |
| 7,719,167 B2 * | 5/2010 | Kwon et al. | 310/328 |
| 7,891,077 B2 * | 2/2011 | Lee et al. | 29/594 |
| 2004/0139588 A1 | 7/2004 | Schreiner et al. | |
| 2004/0263028 A1 | 12/2004 | Pei et al. | |
| 2007/0096227 A1 * | 5/2007 | Lim et al. | 257/416 |
| 2007/0264757 A1 * | 11/2007 | Kwon et al. | 438/127 |
| 2008/0308526 A1 * | 12/2008 | Pandhumsoporn et al. | 216/37 |

FOREIGN PATENT DOCUMENTS

| | | |
|---|---|---|
| JP | 4-12677 A | 1/1992 |
| JP | 4-369277 A | 12/1992 |
| JP | 6-84409 A | 3/1994 |
| JP | 6-334236 A | 12/1994 |
| JP | 7-176802 A | 7/1995 |
| JP | 2009-267429 A | 11/2009 |
| KR | 10-1998-014734 A | 5/1998 |

(Continued)

OTHER PUBLICATIONS

Korean online translation of 10-2008-0100757, Choi, Nov. 19, 2008.*

(Continued)

*Primary Examiner* — Walter Benson
*Assistant Examiner* — Bryan Gordon
(74) *Attorney, Agent, or Firm* — Sughrue Mion, PLLC

(57) ABSTRACT

A multilayer electroactive polymer actuator and a method of manufacturing the same. The multilayer electroactive polymer actuator is divided into an actuating area and a non-actuating area. A plurality of driving electrodes, each formed on a side of the respective polymer layer to correspond to the actuating area. A plurality of extension electrodes connected to the driving electrodes and a common electrode for vertically connecting the extension electrodes are formed to correspond to the non-actuating area. A via hole is formed through the plurality of non-actuating layers and has a diameter which increases in a stepwise manner upwards. The common electrode is formed in the via hole. The driving electrode includes an alloy of aluminum and copper. The extension electrode is formed of material having a small reactivity with respect to laser as compared to the reactivity of the polymer layer.

19 Claims, 18 Drawing Sheets

FOREIGN PATENT DOCUMENTS

| | | |
|---|---|---|
| KR | 100862464 B1 | 10/2008 |
| KR | 10-2008-0100757 A | 11/2008 |
| KR | 10-2009-0011351 A | 2/2009 |
| WO | 2005/086249 A1 | 9/2005 |

OTHER PUBLICATIONS

Ian W. Clelland et. al.: "Multilayer Polymer Film Capacitors Key Components in Differential EMI and RFI Bypass Applications Where Short Circuit and Heat Runaway Failures Cannot be Tolerated", APEC 2003 Exhibitor Seminar, Feb. 11, 2003; pp. 1-49.

Y. Osada and D. E. DeRossi (ed.), Polymer Sensors and Actuators, Springer, Berlin 2000. pp. 15-19, 90-91, 109-111, 149-151, 206-209, 325-327.

Osada, Y., et al., (ed.), Polymer Sensors and Actuators, Springer, Berlin 2000. pp. 15-19, 90-91, 109-115, 149-151, 206-209, 325-327.

Xu, H.-S., et al., All-polymer electromechanical systems consisting of electrostrictive poly(vinylidene flouride-trifluoroethylene) and conductive polyaniline), Journal of Applied Polymer Science, 2000, vol. 75, pp. 945-951.

\* cited by examiner

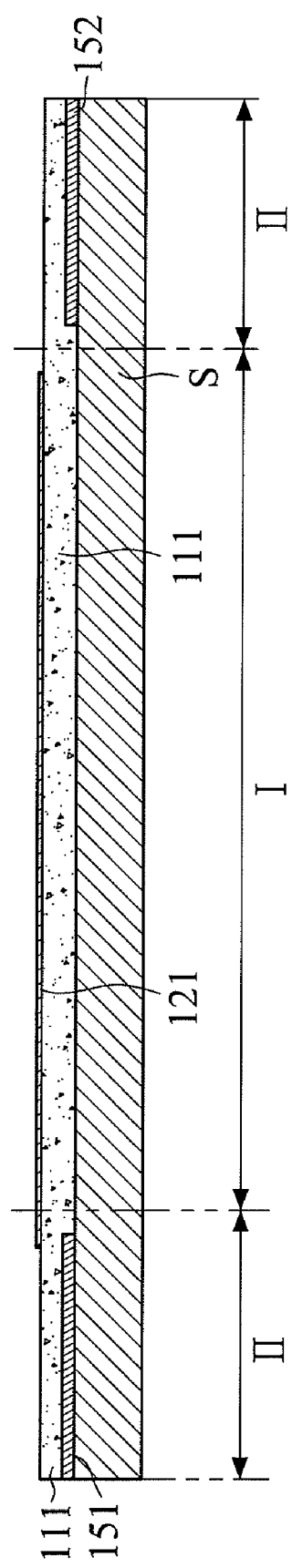

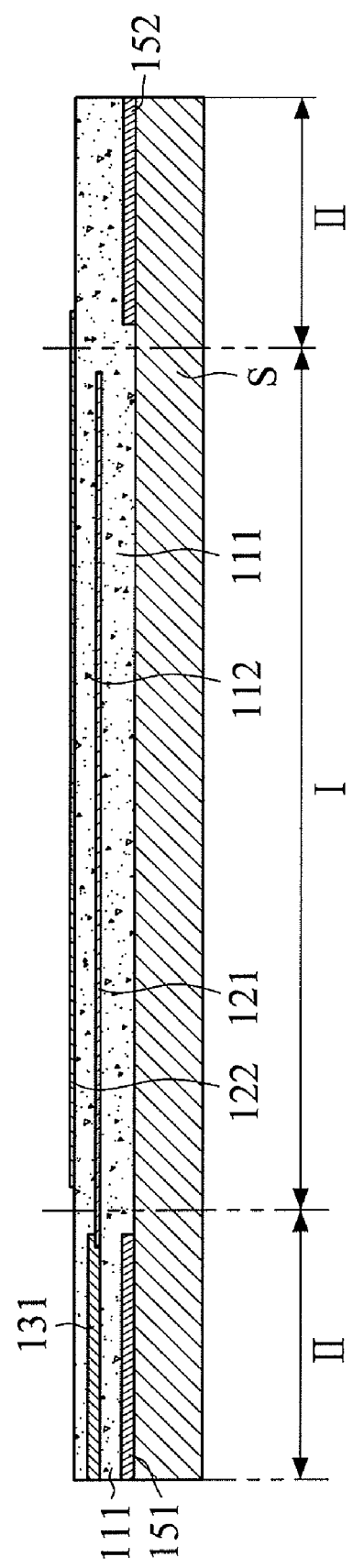

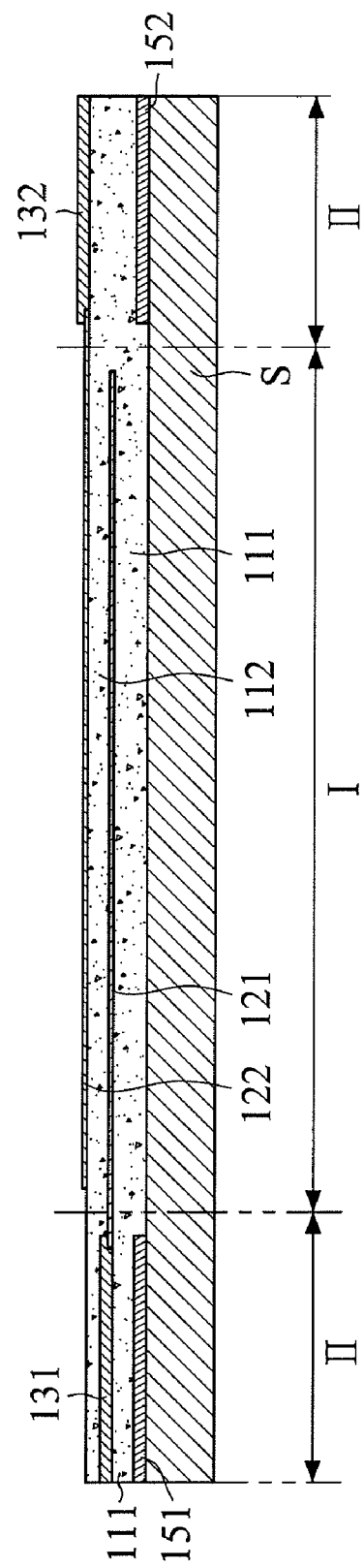

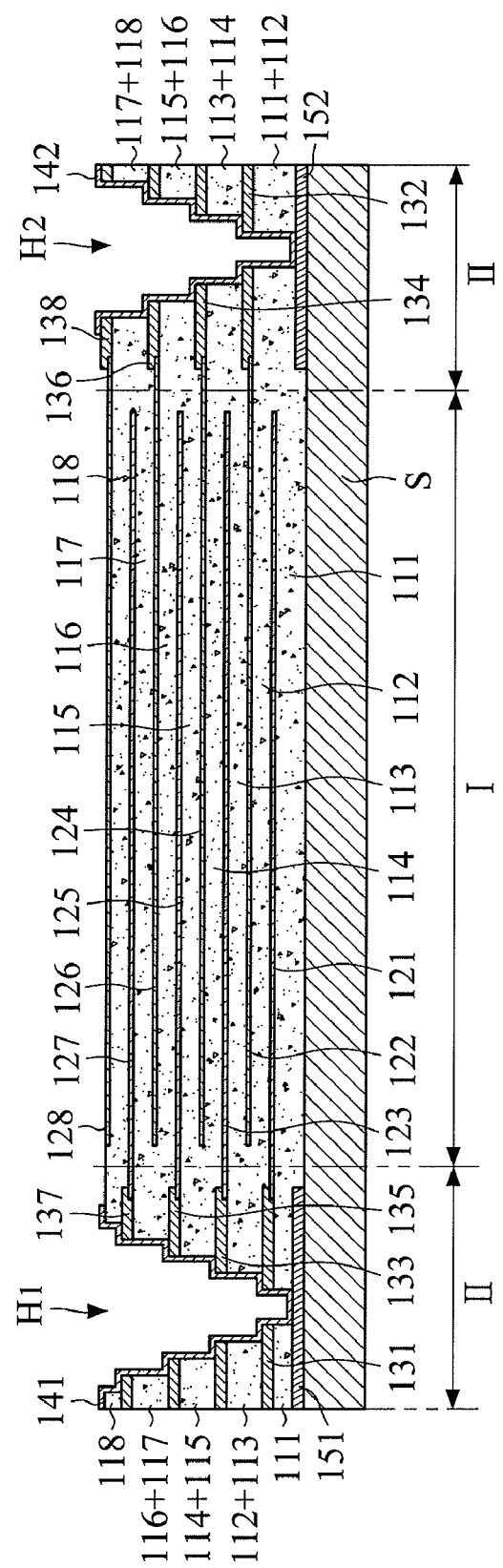

ELECTROACTIVE POLYMER ACTUATOR AND METHOD OF MANUFACTURING THE SAME

CROSS-REFERENCE TO RELATED APPLICATION

This application claims the benefit of Korean Patent Application No. 10-2009-0110503, filed on Nov. 16, 2009, the disclosure of which is incorporated by reference in its entirety for all purposes.

BACKGROUND

1. Field

The following description relates to an actuator, and more particularly, to an ElectroActive Polymer (EAP) actuator and a method of manufacturing the same.

2. Description of the Related Art

An actuator is a power processing device for a remote operation or an automatic control using power. The actuator needs to have a superior durability against frequent uses, high reliability, accuracy of control, good controllability, rapid response, etc. Actuators can be distinguished into types such as hydraulic actuators, pneumatic actuators, electromagnetic motors, shape memory alloys, micro-motors, and ElectroActive Polymer (EAP) actuators.

In recent years, the EAP actuator has gained a large amount of interest. EAP generally refers to polymers whose shape is modified by electric stimulation, and EAP may widely refer to polymers whose shape is modified by chemical stimulation or thermal stimulation in addition to an electric stimulation. The EAP includes types of Ionic Polymer Metal Composites (IPMC), dielectric elastomers, conducting polymers, polymer gels, Polyvinylidene Fluoride resins, carbon nanotubes, shape memory polymers, etc. The EAP actuator is used in various application devices such as micro cameras, polymer Micro Electro Mechanical Systems (MEMS), bio systems, energy harvesting, etc.

Since the EAP actuator has a great mechanical resistance, even a small sized EAP actuator has a relatively large displacement and high generative force in conjunction with the large displacement. For example, the EAP actuator may be used as a driving actuator for a varifocal fluidic lens which is included in a high performance image pick up device in a small sized and thin mobile electronic device. The varifocal fluidic lens is used to implement various functions such as Auto-Focus (AF) function, a zoom function, an Optical Image Stabilization (OIS) function, etc.

However, in order to obtain a high driving force capable of producing a great displacement, a driving voltage needs to be several hundred volts or above. However, a conventional EAP actuator using such a high driving voltage has limited applications in certain devices, such as mobile electronic devices, which operate on relatively low driving voltages, for example 24V or below. In order to reduce the required driving voltage in the actuator, a multilayer EAP polymer actuator has been proposed. The multilayer EAP polymer actuator has a structure in which a plurality of thin polymer layers are stacked up on top of each other while alternately interposing driving electrodes that have different electric potentials therebetween.

SUMMARY

Accordingly, exemplary embodiments provide an interconnection electrode structure for a multilayer EAP actuator, a method of manufacturing the same and a multilayer EAP actuator including the interconnection electrode structure, which has an improved electrical connectivity between driving electrodes.

In another exemplary embodiment, there is provided a multilayer EAP actuator and a method of manufacturing the same, in which each polymer layer has a thin thickness and ensures superior driving performance for a long period of time.

In one exemplary embodiment, there is provided an interconnection electrode structure of a multiplayer EAP actuator including a plurality of non-actuating layers and a common electrode. Each of the non-actuating layers includes a polymer layer provided at an upper surface thereof with an extension electrode. A via hole penetrates through the plurality of non-actuating layers and has a diameter which increases in a stepwise manner upwards. The common electrode is formed in the via hole to connect the extension electrodes exposed by the via hole to each other.

In another exemplary embodiment, there is provided an electroactive polymer actuator. The electroactive polymer actuator includes a plurality of polymer layers and a plurality of driving electrodes. The polymer layers are sequentially stacked up on top of each other and are divided into an actuating area and a non-actuating area. The driving electrodes include an aluminum-copper alloy and are formed on a surface of a respective polymer layer to cover at least the actuating area.

In yet another exemplary embodiment, there is provided a multilayer electroactive polymer actuator including a plurality of polymer layers, a plurality of driving electrodes and a pair of interconnection electrode structures including a first interconnection electrode structure and a second interconnection electrode structure. The polymer layers are sequentially stacked on top of each other and each is divided into an actuating area, and first and second non-actuating areas that are positioned at either side of the actuating area. The driving electrodes are formed on a surface of a respective polymer layer to cover at least the actuating area and include a group of first driving electrodes extending from the actuating area to the first-non actuating area and a group of second driving electrodes extending from the actuating area to the second non-actuating area. The first driving electrode and the second driving electrode are alternately disposed in vertical direction. The first interconnection electrode structure is configured to connect the first driving electrodes to each other in the first non-actuating area and the second interconnection electrode structure is configured to connect the second driving electrodes to each other in the second non-actuating area. Each of the first interconnection electrode structure and the second interconnection electrode structure includes a plurality of non-actuating layers, each including an extension electrode connected to the driving electrode extended in the respective non-actuating area, and a via hole which penetrates through the plurality of non-actuating layers and has a diameter which increases in a stepwise manner upwards; and a common electrode formed in the via hole to connect the extension electrodes exposed by the via hole to each other.

In an exemplary embodiment, there is provided a method of manufacturing a multilayer electroactive polymer actuator. The method is as follows. A first polymer layer is formed on a substrate that is divided into an actuating area, and first and second non-actuating areas that are positioned at either side of the actuating area. A first driving electrode is formed on the first polymer layer to cover at least the actuating area while extending to the first non-actuating area. A first extension electrode is formed which is connected to the first driving electrode, on the first-non actuating area of the first polymer layer. A second polymer layer is formed on the entire upper surface of the first polymer layer that includes the first driving electrode and the first extension electrode. A second driving electrode is formed on the second polymer layer to cover at least the actuating area while extending to the second non-actuating area. A second extension electrode is formed which is connected to the second driving electrode, on the second-non actuating area of the second polymer layer. A plurality of non-actuating layers are formed on the first non-actuating area and the second non-actuating area by repeating the process from forming the first polymer layer to forming the second extension electrode at least once. A via hole is formed which has a diameter which increases upwards in a stepwise manner by etching the non-actuating layers. A common electrode is formed in the via hole to connect the extension electrodes exposed by the via hole to each other.

Other features will become apparent to those skilled in the art from the following description of exemplary embodiments taken in conjunction with the attached drawings.

BRIEF DESCRIPTION OF THE DRAWINGS

FIGS. 7A to 7J are views showing an exemplary embodiment of a method of manufacturing a multilayer EAP actuator.

Elements, features, and structures are denoted by the same reference numerals throughout the drawings and the detailed description, and the size and proportions of some elements may be exaggerated in the drawings for clarity and convenience.

DETAILED DESCRIPTION

The following detailed description is provided to assist the reader in gaining a comprehensive understanding of the methods, apparatuses and/or systems described herein. Various changes, modifications, and equivalents of the systems, apparatuses and/or methods described herein will suggest themselves to those of ordinary skill in the art. Descriptions of well-known functions and structures are omitted to enhance clarity and conciseness.

Figure 1:
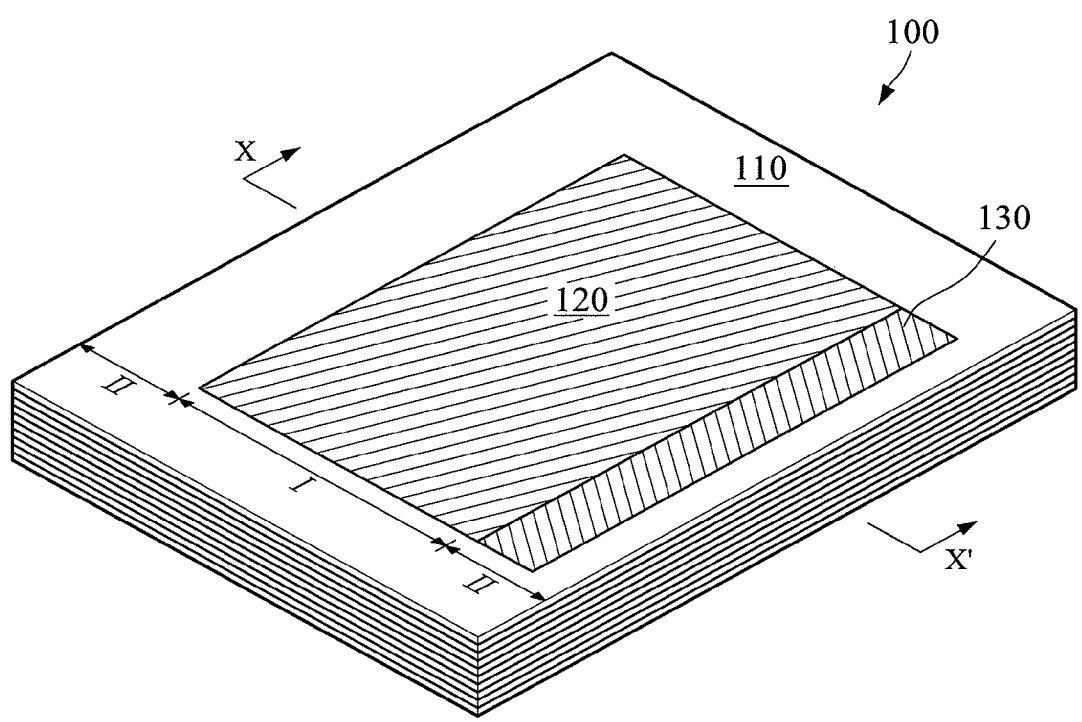
FIG. 1 is a perspective view showing a schematic configuration of an exemplary embodiment of a multilayer Electro-Active Polymer (EAP) actuator.
Figure 6A:
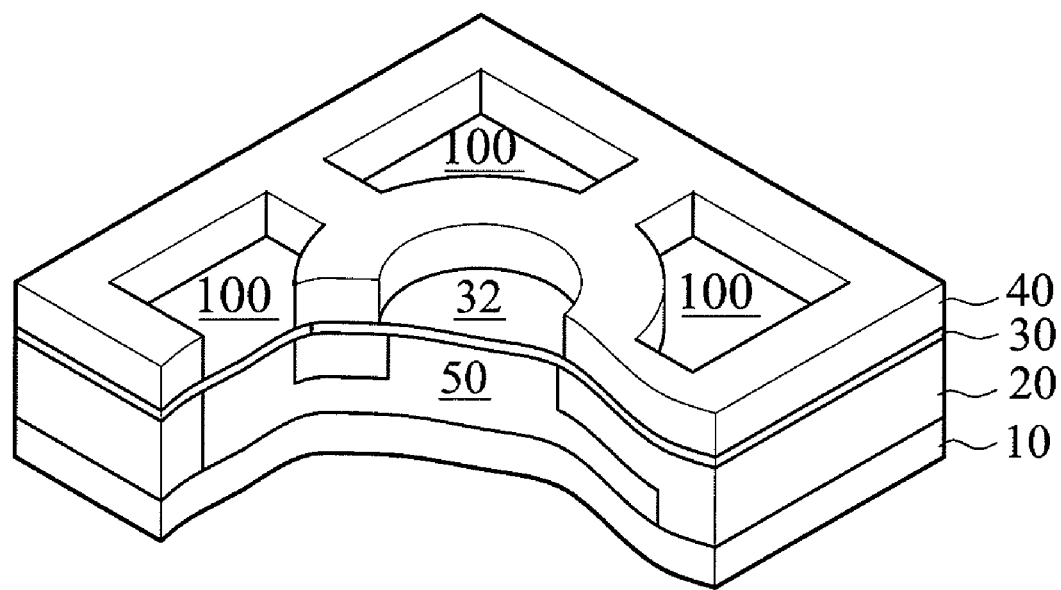
FIG. 6A is a perspective view showing a partially cut out portion of a varifocal fluidic lens to which exemplary embodiments of the multilayer EAP actuator may be applied.
Figure 6B:
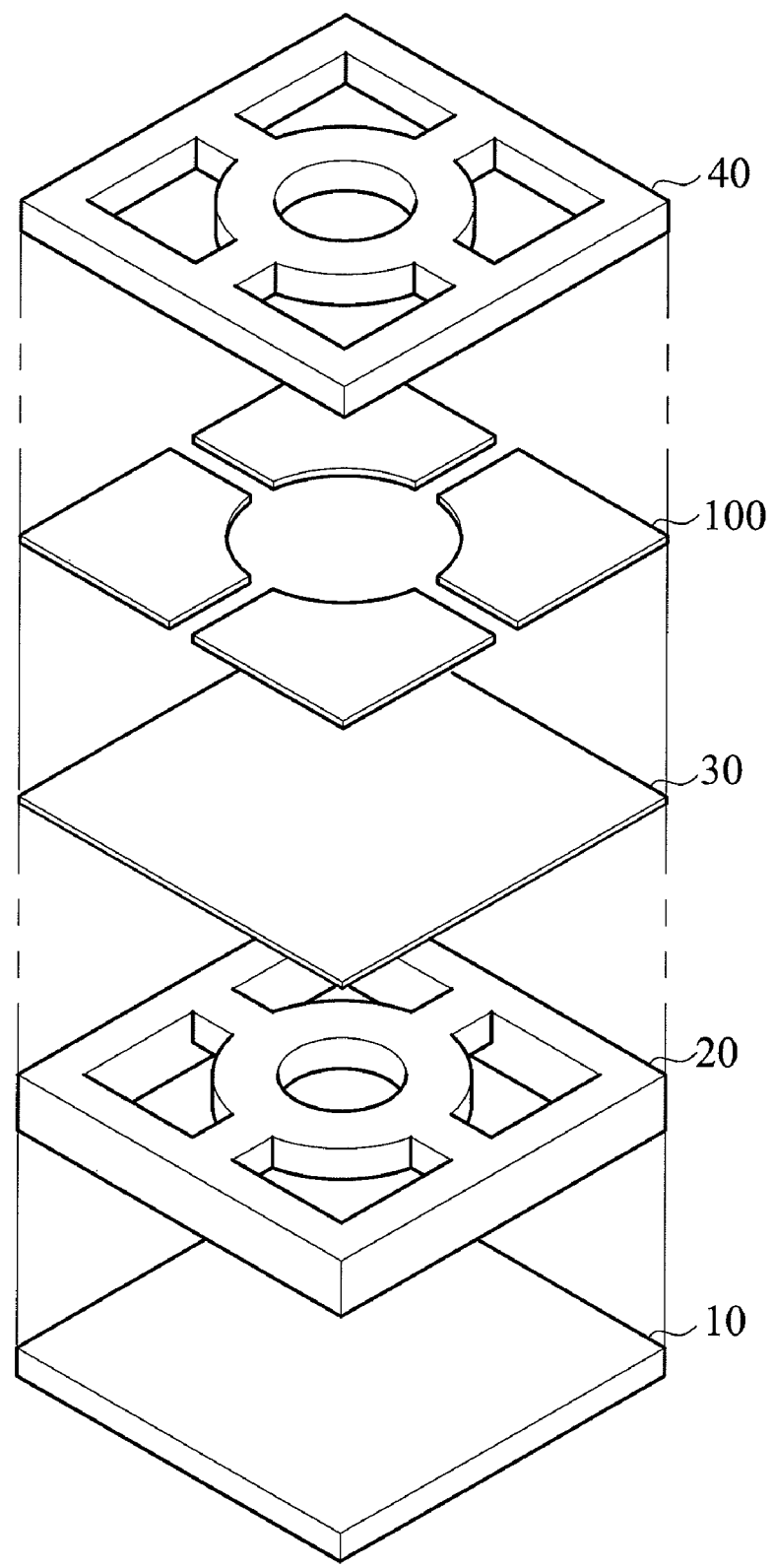
FIG. 6B is an exploded perspective view showing a varifocal fluidic lens to which exemplary embodiments of the multilayer EAP actuator may be applied.

Hereinafter, the exemplary embodiments will be described with reference to accompanying drawings. FIG. 1 is a perspective view showing a schematic configuration of an example of a multilayer ElectroActive Polymer (EAP) actuator. Although the multilayer EAP actuator is provided in a rectangular shape as viewed from above, the multilayer EAP actuator is not limited to this shape and may vary depending on application devices to which the multilayer EAP actuator is applied. For example, the multilayer EAP actuator may be provided in a polygonal shape as shown in FIGS. 6A and 6B.

As shown in FIG. 1, the multilayer EAP actuator 100 may be divided into an actuating area (I) and a non-actuating area (II). The division is not determined based on a physical structure, but on a functional characteristic. The actuating area (I) represents an area which produces a displacement by receiving a driving voltage. Accordingly, the planar shape of the actuating area (I) viewed from above corresponds to a planar shape of driving electrodes that overlap each other. The planar view of the actuating area (I) is not limited thereto and may be provided in various forms. For example, the actuating area (I) may be provided in a polygonal shape having at least two parallel faces, for example a trapezoidal shape.

In a broad sense, the non-actuating area (II) represents the entire area of the EAP actuator 100 except for the actuating area (I). In this case, the non-actuating area (II) may be used to electrically connect driving electrodes 120 stacked on top of each other or to allow the EAP actuator 100 to be physically fixed to application devices. In a narrow sense, the non-actuating area (II) represents a portion including an interconnection electrode structure (see FIG. 3) for electrically connecting the stacked driving electrodes 120 to each other. Whether the non-actuating area refers to the terms of narrow sense or the terms of broad sense needs to be adaptively determined based on the specific context.

As shown in FIG. 1, the multilayer EAP actuator 100 includes a plurality of polymer-electrode layers (hereinafter, a polymer-electrode layer of the actuating area (I) is referred to as an 'actuating layer' and a polymer-electrode layer of the non-actuator area (II) is referred to as an 'non-actuating layer'). The polymer-electrode layer includes a polymer layer 110, a driving electrode 120 and an extension electrode 130. The driving electrode 120 is formed on a surface of the actuating area (I) of each polymer layer 110, for example, an upper surface of the actuating area (I). The driving electrode 120 is provided in a predetermined size suitable for covering the entire upper surface of the actuating area (I) and extending to the non-actuating area (II). A portion extending to the non-actuating area (II) is used for connection to the extension electrode 130 and can be provided in various sizes and shapes. The extension electrode 130 is formed on one surface of the non-actuating area (II) of each polymer layer 120, for example, an upper surface of the non-actuating area (II). As will be described later in this disclosure, the extension electrode 130 is in contact with the driving electrodes 120 such that the driving electrodes 120 are electrically connected to each other. For convenience sake, when the non-actuating area (II) is described with reference to FIGS. 2A and 2B in conjunction with FIG. 1 later, elements for connecting the extension electrode 130, for example, the description of a via hole $H_1$ and $H_2$ and a common electrode formed in the non-actuating area (II) is omitted which is to be described with reference to FIG. 3.

Figure 2A:
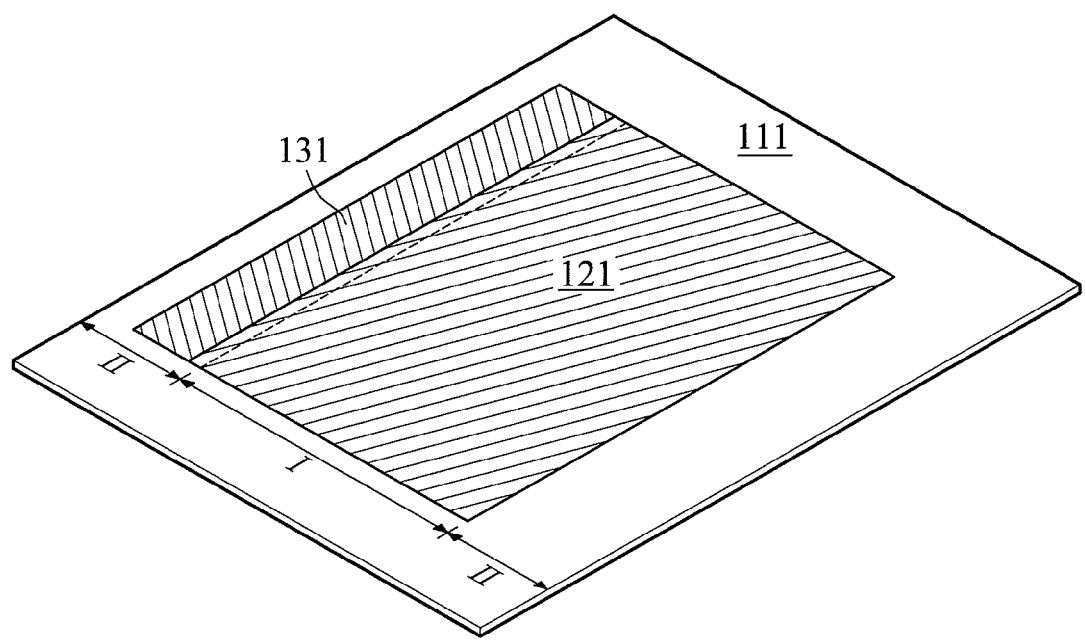
FIGS. 2A and 2B are views showing a schematic configuration of an exemplary embodiment of a pair of polymer-electrode layers that form the multilayer EAP actuator of FIG. 1.
Figure 2B:
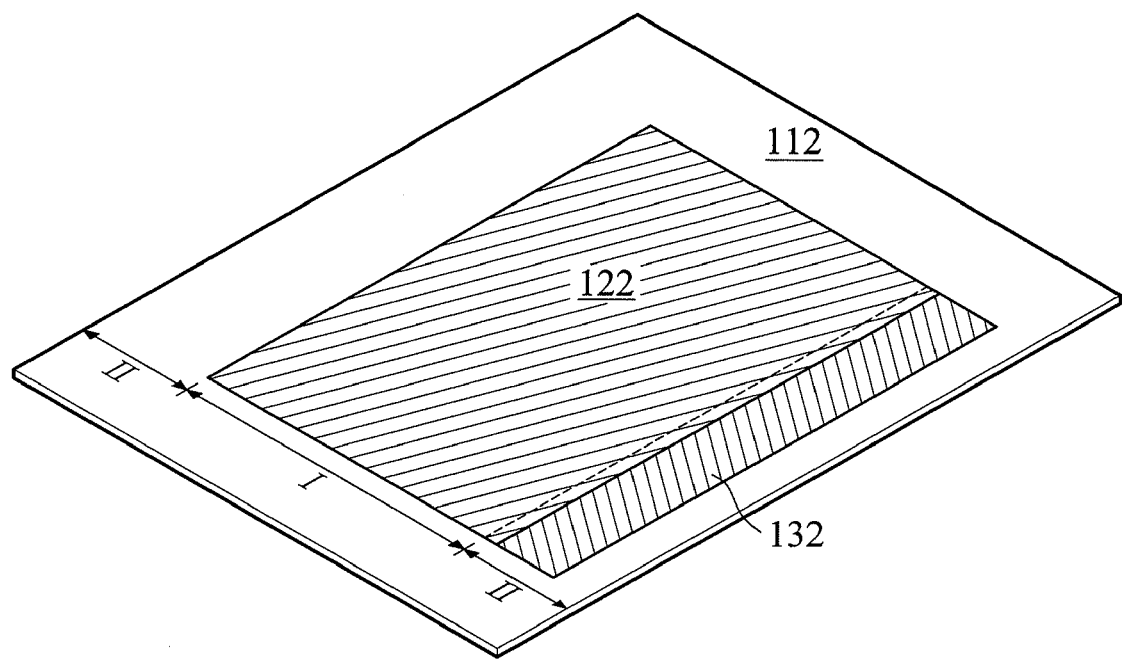

FIGS. 2A and 2B are views showing a schematic configuration of an example of a pair of polymer-electrode layers, that is, the actuating layer and the non-actuating layer, that form the multilayer EAP actuator of FIG. 1. That is, the multilayer EAP actuator 100 has a combination of polymer-electrode layers shown in FIGS. 2A and 2B. In more detail, in the multilayer EAP actuator 100, two types of polymer-electrode layers are alternately stacked up on top of each other. For example, the multilayer EAP actuator 100 shown in FIG. 3 includes 8 polymer-electrode layers, in which odd numbered layers, including a first layer, a third layer, a fifth layer and a seventh layer (hereinafter, referred to as a first group of layers), have a structure shown in FIG. 2A and even numbered layers, including a second layer, a fourth layer, a sixth layer and a eighth layer (hereinafter, referred to as a second group of layers), have a structure shown in FIG. 2B. Alternatively, the first group of layers of the multilayer EAP actuator 100 may have a structure shown in FIG. 2B and the second group of layers of the multilayer EAP actuator 100 may have a structure shown in FIG. 2A.

The polymer-electrode layers of the first group of layers and the second group of layers have a similarity in that the polymer-electrode layer of the first group of layers and the polymer-electrode layer of the second group of layers include a polymer layer 111 and a polymer layer 112, respectively, that correspond to an example of the polymer layer 110 shown in FIG. 1, a driving electrode 121 and a driving electrode 122, respectively, that correspond to an example of the driving electrode 120 shown in FIG. 1, and an extension electrode 131 and an extension electrode 132, respectively, that correspond to an example of the extension electrode 130 shown in FIG. 1. However, the polymer-electrode layer of the first group of layers is different from that of the second group of layers on the position of the extension electrodes 131 and 132 with respect to the driving electrodes 121 and 122. For example, the extension electrodes 131 and 132 of the first group of layers and the second group of layers may be disposed adjacent to the driving electrodes 121 and 122, respectively while alternating each other. The reason why the extension electrodes 131 and 132 are disposed in different positions between the first group of layers and the second group of layers is that the driving electrodes are grouped into different groups for each group of layers such that the driving electrodes for one particular group are all electrically connected under the same electric potential. Accordingly, the multilayer EAP actuator 100 has a configuration including a positive electric potential driving electrode and a negative elective potential driving electrode that are alternately disposed while interposing a thin polymer layer therebetween.

The polymer layers 111 and 112 may be formed of dielectric polymer material whose shape is modified by electric stimulation. For example, the polymer layers 111 and 112 may be formed of a dielectric elastomer such as silicon or acrylate, a ferro-electric polymer such as Poly VinyliDene Fluoride (PVDF), or a relaxor ferro-electric polymer such as P(VDF-TrFE-CFE)(Poly(VinyliDene Fluoride-TriFluoroEthylene-ClorOFluoroEthylene)). The polymer layers 111 and 112 are formed of the above material to be thin, and are interposed between driving electrodes having opposite polarities, thereby forming an actuator operating at a low voltage. The polymer layers 111 and 112 may have a thickness of 2.5 μm or below.

The driving electrodes 121 and 122 serve to receive a driving voltage causing a modification of the polymer layers 111 and 112. To this end, the driving electrodes 121 and 122 may be formed of conductive materials. For example, the driving electrodes 121 and 122 may be formed of metals such as gold (Au), copper (Cu), titanium (Ti), chromium (Cr), molybdenum (Mo), aluminum (Al) and aluminum-copper (Al—Cu) alloys. Alternatively, the driving electrodes 121 and 122 may be formed of conductive polymer such as PEDOT [(POLY(3,4-EthyleneDiOxyThiophene]: PSS [Poly(4-StyreneSulfonic acid)], polypyrrole, polyaniline, etc. If the driving electrodes 121 and 122 are formed of aluminum (Al) or an aluminum-copper (Al—Cu) alloy, even if the polymer layers 111 and 112 have a thin thickness of 2.5 μm or below, electrical current does not flow through the alternating extension electrodes by the void of the polymer layers 111 and 112.

The driving electrodes 121 and 122 need to be formed to as small a thickness as possible so as to not influence modification of the polymer layers 111 and 112. For example, the driving electrodes 121 and 122 are provided in a thickness of 50 nm or below. However, if the driving electrodes 121 and 122 are formed of aluminum (Al) to a thickness of 50 nm, a hillock effect occurs due to electro-migration that is inherent in aluminum (Al), and this hillock effect causes gradual degradation of the driving performance of the driving electrodes 121 and 122 over time.

In order to solve the gradual degradation of the aluminum (Al) electrode, the driving electrodes 121 and 122 are formed of an aluminum-copper (Al—Cu) alloy. The small amount of copper contained in the aluminum-copper alloy prevents the electro-migration phenomenon. As a result, the power durability of the driving electrodes 121 and 122 is improved and the degradation of the driving electrodes 121 and 122 is prevented over a long period of operation.

The extension electrodes 131 and 132 are disposed in the non-actuating area corresponding to either side of the driving electrodes 121 and 122 and are electrically connected to the driving electrodes 121 and 122, respectively. A driving voltage is applied to the driving electrodes 121 and 122 through the extension electrodes 131 and 132. However, if the driving electrodes 121 and 122 have a small thickness, the electrical resistance of the driving electrodes 121 and 122 is high. That is, the portion of the driving electrode more distant from a power unit or from the extension electrodes 131 and 132 exhibits a lower operation performance. Accordingly, different portions of the driving electrodes 121 and 122 exhibit different driving performance, and this degrades the operating performance of the EAP actuator.

In order to prevent such a performance degradation, the extension electrodes 131 and 132 may be provided in an extended rectangular shape along edges of the driving electrodes 121 and 122, respectively. In addition, the extension electrodes 131 and 132 may have a thickness larger than those of the driving electrodes 121 and 122, for example, 50 nm or above and may be formed of metal material, for example, gold (Au), copper (Cu), titanium (Ti), chromium (Cr), molybdenum (Mo), and aluminum (Al), such that the extension electrodes 131 and 132 have low electrical resistance. In this manner, extension electrodes 131 and 132 formed in an extended rectangular shape having a relatively larger thickness are disposed along edges of the driving electrodes 121 and 122, the driving voltage is uniformly applied over the entire surface of the actuating area (I) or the driving electrodes 121 and 122. Accordingly, the multilayer EAP actuator provides uniform driving performance independent of a portion of the driving electrode.

If the driving electrodes 121 and 122 are formed of an aluminum-copper (Al—Cu) alloy, the extension electrodes 131 and 132 may be formed of any material except for an aluminum-copper (Al—Cu) alloy. This is because the aluminum-copper (Al—Cu) alloy is highly reactive with respect to laser, described later in a detailed description of a method of manufacturing a multilayer electroactive polymer actuator. Yet, if the driving electrodes 121 and 122 are formed of material that does not react strongly with respect to laser, the extension electrodes 131 and 132 may be formed of the same material as the driving electrodes 121 and 122 and may have a thickness equal to or greater than those of the driving electrodes 121 and 122. In this case, the extension electrodes 131 and 132 need to have a predetermined thickness to cause a predetermined level of energy consumption of a laser during a laser etching process (see FIG. 7I). Accordingly, although the driving electrodes 121 and 122 and the extension electrodes 131 and 132 are shown as separate parts, it would be obvious to those of ordinary skill in the art that the driving electrodes 121 and 122 and the extension electrodes 131 and 132 may be formed as an integrated part. In this case, the extension electrodes 131 and 132 each may be represented as a part of the driving electrodes 121 and 122 extending to the non-actuating area (II).

Figure 3:
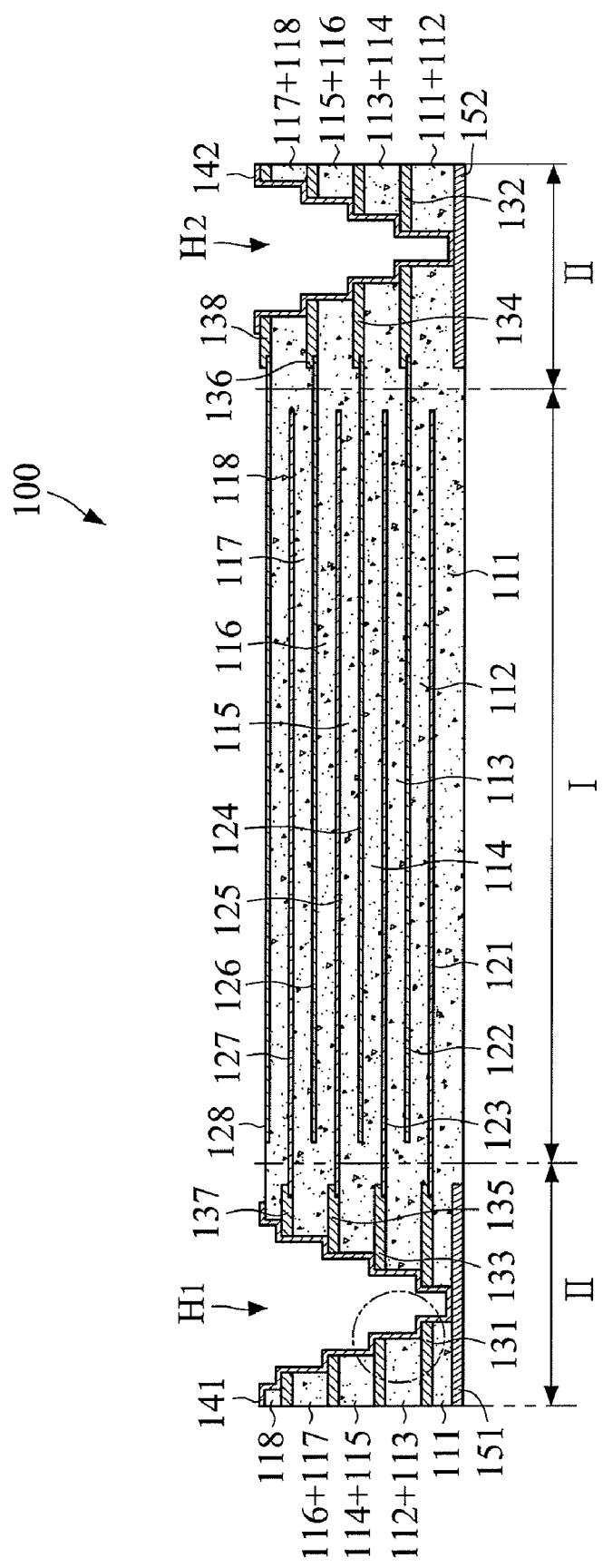
FIG. 3 is a cross sectional view taken along line X-X' of FIG. 1.

FIG. 3 is a cross sectional view of the multilayer EAP actuator taken along line X-X' of FIG. 1. As shown in FIG. 3, the multilayer EAP actuator 100 includes eight polymer-electrode layers, but exemplary embodiments may be provided with a different number of polymer-electrode layers. Absent from FIG. 1, FIG. 3 shows an interconnection electrode structure for electrically connecting the stacked driving electrodes 111 to 118 in groups.

As shown in FIG. 3, the multilayer EAP actuator 100 which is divided into the actuating area (I) and the non-actuating area (II), and includes eight polymer-electrodes layers. Each of the polymer-electrode layers includes a polymer layer denoted as one of reference numerals 111 to 118, each corresponding to the polymer layer depicted by reference numeral 110 FIG. 1, a driving electrode denoted as one of reference numerals 121 to 128 each corresponding to the driving electrode depicted by reference number 120, in FIG. 1, and an extension electrode denoted as one of reference numerals 131 to 138 corresponding to the extension electrode depicted by reference numeral 130, in FIG. 1.

Each of the driving electrodes 121 to 128 is formed on one surface of a respective polymer layer 111 to 118 covering at least the actuating area (I). In order for a positive driving voltage and a negative driving voltage to be alternately applied to the driving electrodes 121 to 128, the driving electrodes 121 to 128 are divided into two groups of driving electrodes and respective polymer-electrode layers are divided into two groups of polymer electrode layers, with the first group of driving electrodes connected to a positive electric potential and the second group of driving electrodes connected to a negative electric potential. To this end, the driving electrodes included in the same group are electrically connected to each other through an interconnection electrode structure that is formed on the non-actuating area (II). More specifically, the driving electrodes 121, 123, 125 and 127 of the first group of layers corresponding to odd numbered polymer-electrode layers extend to the non-actuating area (II) disposed on the left of the actuating area (I) in FIG. 3 and are in contact with the corresponding extension electrodes 131, 133, 135 and 137 of the first group of layers, and the extension electrodes 131, 133, 135 and 137 of the first group of layers are in contact with each other through a first common electrode 141. The driving electrodes 122, 124, 126 and 128 of the second group of layers corresponding to even numbered polymer-electrode layers extend to the non-actuating area (II) disposed on the right of the actuating area (I) in FIG. 3 and are in contact with the corresponding extension electrodes 132, 134, 136 and 138 of the second group of layers, and the extension electrodes 132, 134, 136 and 138 of the second group of layers are in contact with each other through a second common electrode 142.

As described above, the multi EAP actuator 100 has a pair of interconnection electrode structures. In a narrow sense, the interconnection electrode structure may refer to a conductive element including the extension electrodes 131, 133, 135, and 137 or 132, 134, 136 and 138 and the common electrodes 141 and 142. Alternatively, in a broad sense, the interconnection electrode structure may refer to surrounding elements including a polymer layer, a via hole, an etch stopping layer, etc. in addition to the conductive element. Hereinafter, the interconnection electrode structure will be described in a broad sense.

For the non-actuating area shown on the left hand side of FIG. 3, the interconnection electrode structure may further include an etch stopping layer 151 in addition to a plurality of non-actuating layers and the common electrode 141. For the left side non-actuating area, the non-actuating layers include polymer layers 111, 112+113, 114+115, 116+117 and 118, and extension electrodes 131, 133, 135 and 137 that are formed on one surface of the polymer layers 111, 112+113, 114+115, 116+117 and 118, respectively. The extension electrodes 131, 133, 135 and 137 are connected to the driving electrodes 111, 113, 115 and 117 of the first group of layers, respectively. Similarly, for the right side non-actuating area, the non-actuating layers include polymer layers 111+112, 113+114, 115+116, and 117+118, and extension electrodes 132, 134, 136 and 138 that are formed on one surface of the polymer layers 111+112, 113+114, 115+116, and 117+118, respectively. The extension electrodes 132, 134, 136 and 138 are connected to the driving electrodes 112, 114, 116 and 118 of the second group of layers, respectively. Hereinafter, the following description will be made in relation to the left side actuating area (II). It would be obvious to one of ordinary skill in the art that the description can also be applied to the right hand side actuating area (II).

The extension electrodes 131 to 138 are formed of conductive material, and there are no particular restrictions on the material of the extension electrodes 131 to 138. The extension electrodes 131 to 138 may be formed of material that is less reactive to laser than a polymer. For example, the extension electrodes 131 to 138 may be formed of a material selected from the group consisting of gold (Au), copper (Cu), titanium (Ti), chromium (Cr), molybdenum (Mo), and aluminum (Al). If the extension electrodes 131 to 138 are formed of metal, a via hole $H_1$ having a diameter which increases in a stepwise manner is formed all the way through the stacked non-actuating layers using a one step laser process. The extension electrodes 131 to 138 may each have a thickness of, for example, 50 to 500 nm, greater than that of each of the driving electrodes 121 to 128.

The via holes $H_1$ and $H_2$ are formed all the way through the non-actuating layers. The via holes $H_1$ and $H_2$ have a diameter which increases toward the uppermost non-actuating layer in a stepwise manner. As a result, the widths of the non-actuating layers, that is, the widths of the polymer layers 111, 112+113, 114+115, 116+117 and 118, and the extension electrodes 131, 133, 135 and 137 that are formed on the polymer layers 111, 112+113, 114+115, 116+117 and 118, respectively, decrease in an upwards direction. Similarly, the non-actuating layers, that is, the width of the polymer layers 111+112, 113+114, 115+116 and 117+118, and the extension electrodes 132, 134, 136 and 138 that are formed on the polymer layers 111+112, 113+114, 115+116 and 117+118, respectively, decrease in an upwards direction. Such a structure of the via hole $H_1$ allows some parts of individual upper surfaces of the extension electrodes 131, 133, 135 and 137 to be exposed. That is, some parts of the individual extension electrodes 131, 133, 135 and 137 are respectively covered by the polymer layers formed on the upper surfaces of the individual extension electrodes 131, 133, 135 and 137, respectively. However, remaining parts of the individual extension electrodes 131, 133, 135 and 137 are exposed through the via hole $H_1$.

In addition, the via hole $H_1$ is formed therein with the common electrode 141. (Similarly, the via hole $H_2$ is formed therein with the common electrode 142.) The common electrode 141 may be provided in a uniform thickness to correspond to the profile of the via hole $H_1$ or to have a thickness depending on position within the via hole $H_1$. Alternatively, the common electrode 141 may completely fill in the via hole $H_1$. In any of the above cases, the common electrode 141 has at least a step-shape profile. Such a common electrode 141 makes contact with the individual upper surfaces of the extension electrodes 131, 133, 135 and 137 such that the extension electrodes 131, 133, 135 and 137 are electrically connected to each other. Accordingly, the driving electrodes 121, 123, 125, and 127 making contact with the extension electrodes 131, 133, 135 and 137, respectively, are electrically connected to each other.

Figure 4:
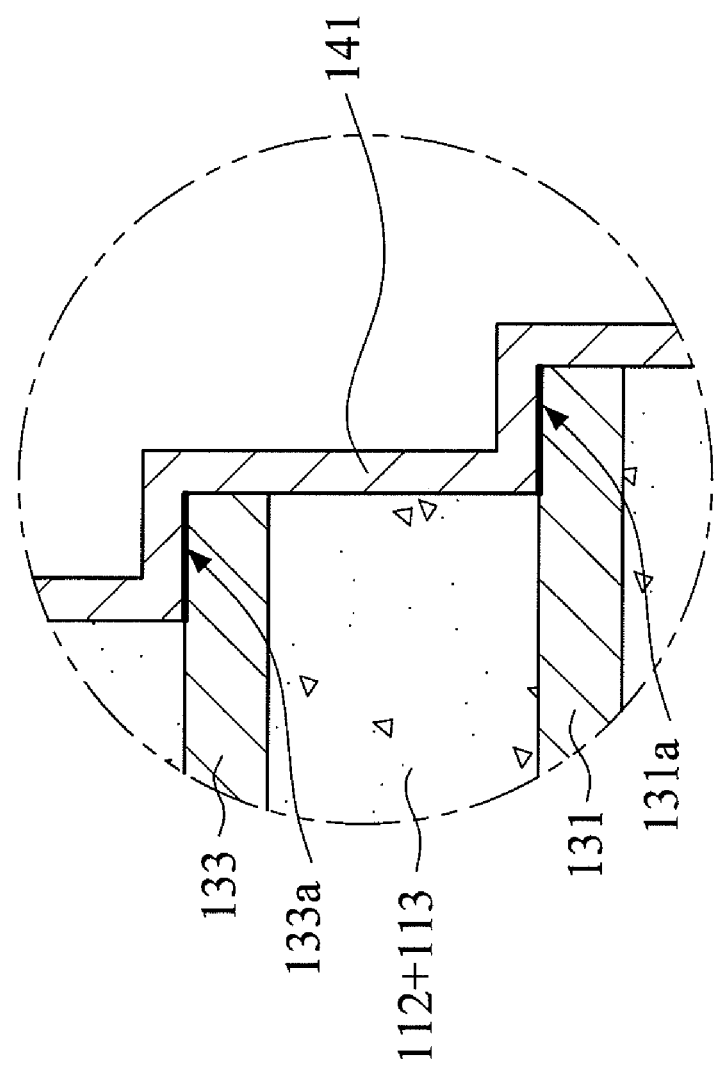
FIG. 4 is an enlargement view showing a part corresponding to the dotted line of FIG. 3.

FIG. 4 is an enlarged view showing a part corresponding to the dotted line of FIG. 3. As shown in FIG. 4, a second non-actuating layer including a second and third polymer layer 112+113 and a third extension electrode 133 formed on the second and third polymer layer 112+113 has a width smaller than that of a first non-actuating layer including a first polymer layer 111 and a first extension electrode 131 formed on the first polymer layer 111. Accordingly, the second actuating layer is not formed on a part 131a of the upper surface of the first extension electrode 131. Similarly, a third non-actuating layer is not formed on a part 133a of the upper surface of the third extension electrode 133.

As described above, according to the structure of the non-actuating layers in which parts 131a and 133a of the extension electrodes are exposed and the via hole $H_1$ has a diameter which increases in a stepwise manner in the non-actuating layers, the common electrode 141 formed in the via hole $H_1$ has a step-shape profile. As the common electrode 141 has a step-shape profile, upper surfaces and lateral sides of the common electrode 141 are in contact with the extension electrodes 131, 133, 135 and 137, thereby increasing the contact area. Accordingly, the interconnection electrode structure shown in FIG. 3 provides an improved electrical connectivity between the common electrode 141 and the extension electrodes 131, 133, 135 and 137, and therefore, the electrical connectivity between the extension electrodes 131, 133, 135 and 137 and the driving electrodes 121, 123, 125 and 127 is also improved.

Figure 5:
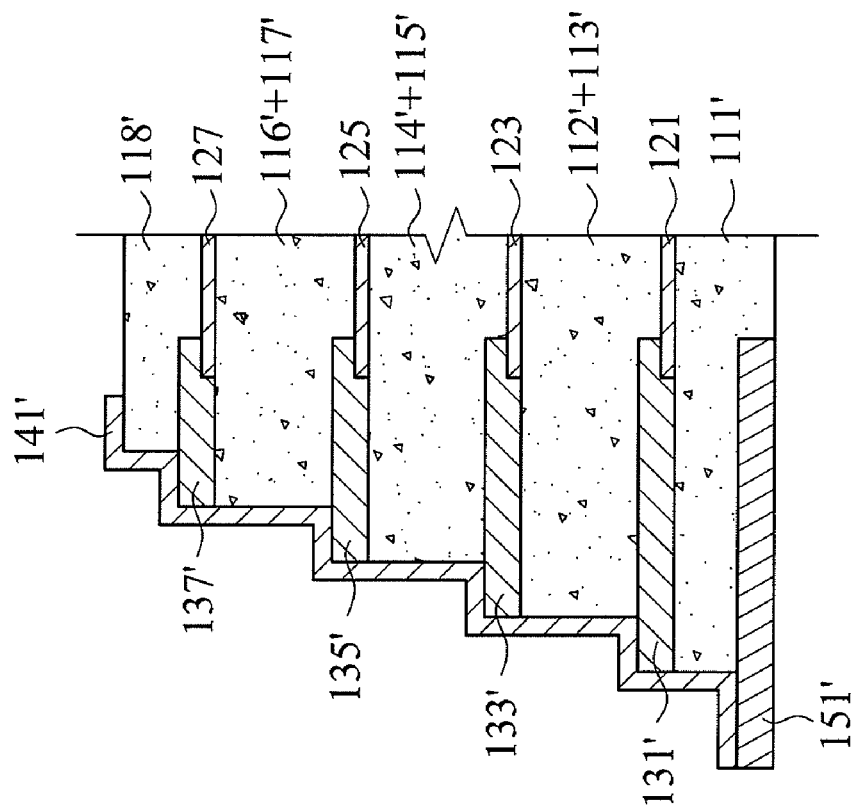
FIG. 5 is a view showing another exemplary embodiment of an interconnection electrode structure.

FIG. 5 is a view showing another example of an interconnection electrode structure. As shown in FIG. 5, the interconnection electrode structure may further include an etch stopping layer 151' in addition to a plurality of non-actuating layers and a common electrode 141'. The non-actuating layers include polymer layers 111', 112'+113', 114'+115', 116'+117' and 118', and extension electrodes 131', 133', 135' and 137' that are formed on each upper surface of the polymer layers 111', 112'+113', 114'+115', 116'+117' and 118', respectively. The extension electrodes 131', 133', 135' and 137' are connected to the driving electrodes 111', 113', 115' and 117' of a first group of layers, respectively.

Different from the interconnection electrode structure shown in FIG. 3 that is formed therein with a via hole, the interconnection electrode structure shown in FIG. 5 has no need of a via hole. Instead, the non-actuating layers are formed with one side having a step profile and as such have widths which decrease in a stepwise manner upwards. Accordingly, the widths of the polymer layers 111', 112'+113', 114'+115', 116'+117' and 118', and extension electrodes 131', 133', 135' and 137' that are formed on each upper surface of the polymer layers 111', 112'+113', 114'+115', 116'+117' and 118', respectively, decrease in an upward direction. Such a structure of the non-actuating layers allows some parts of individual upper surfaces of the extension electrodes 131', 133', 135' and 137' to be exposed. In addition, the exposed upper surfaces of the individual extension electrodes 131', 133', 135' and 137' make contact with the common electrode 141'. In this manner, the common electrode 141' connecting the stacked extension electrodes 131', 133' 135' and 137' to each other forms a step shape profile and thus improves the electrical connection of the common electrode 141' with respect to the extension electrodes 131', 133', 135' and 137'.

As described above in detail, according to the interconnection electrode structure of the multilayer EAP actuator, the extension electrodes each have upper surfaces partially exposed, so a common electrode electrically connecting the stacked extension electrode to each other forms a step shape profile to make contact with the exposed upper surfaces of the extension electrodes. Accordingly, the above interconnection electrode structure provides an improved electrical connectivity among the stacked extension electrodes and among the driving electrodes connected to the extension electrode. In addition, if the driving electrodes are formed of an aluminum-copper (Al—Cu) alloy, even if the polymer layers are thin, current flow and an electromigration phenomenon between the driving electrodes are prevented.

The multilayer EAP actuator described above is small and thin and also provides a large displacement, and thus can provide a wide range of applications. For example, the multilayer EAP actuator may be applied to a varifocal fluidic lens. The varifocal fluidic lens is a device allowing functions such as an Auto-Focus (AF) function, an Optical Image Stabilization (OIS) function and a varifocal function, etc. of a micro-sized Image Sensor Module (ISM) used in a high performance camera for a mobile device.

FIG. 6A is a perspective view showing a partially cut out portion of a varifocal fluidic lens to which the multilayer EAP actuator is applied. FIG. 6B is an exploded perspective view showing a varifocal fluidic lens to which the multilayer EAP actuator is applied. As shown in FIGS. 6A and 6B, the varifocal fluidic lens includes a substrate 10, a spacer frame 20, a membrane 30, a multilayer EAP actuator 100 and a fixing frame 50.

The substrate 10 is formed of transparent material, for example, glass or transparent polymer. The spacer frame 20 is used to define an inner space of the varifocal fluidic lens, which may be filled with optical fluid and may be formed of non transparent material such as silicon (Si). The inner space is divided into an upper portion and a lower portion. The upper portion is divided into a lens portion formed in the center of the inner space and a plurality of driving portions. The lower portion may be formed as one space such that optical fluid flows all the way through the inner space of the lower portion.

The membrane 30 covers at least the lens portion, serving as a lens surface. The membrane 30 may cover the driving portions or not. The lens portion is filled with optical fluid to serve as a lens allowing incident light to pass therethrough. The driving portions transmit a driving force capable of modifying a profile of a part (lens surface) of the membrane 30 covering the lens portion. Although the example of the varifocal fluidic lens includes four driving portions formed at respective outer sides of the lens portion, the driving portions may be provided in differing numbers and locations.

As depicted, the multilayer EAP actuator 100 is disposed on the membrane 30. Specifically, the actuating area of the multilayer EAP actuator 100 covers at least the driving portions. If a driving voltage is applied, the multilayer EAP actuator 100 produces a displacement downward and applies a predetermined pressure to the driving portions. As a predetermined pressure is applied to the driving portions from an upper side thereof, the optical fluid contained in the driving portions moves toward the lens portion. The optical fluid transferred from the driving portions increases the amount of optical fluid contained in the lens portion, and the lens portion bulges upwards.

The fixing frame 40 is disposed on the multilayer EAP actuator 100 to firmly fix the membrane 30 and/or the multilayer EAP actuator 100 to the spacer frame 20. The fixing frame 40 may have a planar shape exposing at least the lens portion and may expose the multilayer EAP actuator 100. The fixing frame 40 may be formed of silicon.

Hereinafter, a method of manufacturing a multilayer EAP actuator 100 will be described with reference to FIGS. 7A to 7J in conjunction with FIG. 3. The multilayer EAP actuator manufacturing method mainly includes alternately stacking two types of polymer layers each of which is provided, at one side thereof, with a driving electrode and an extension electrode, and forming an interconnection electrode structure on a non-actuating area (II) of the stacked polymer layers.

Figure 7A:
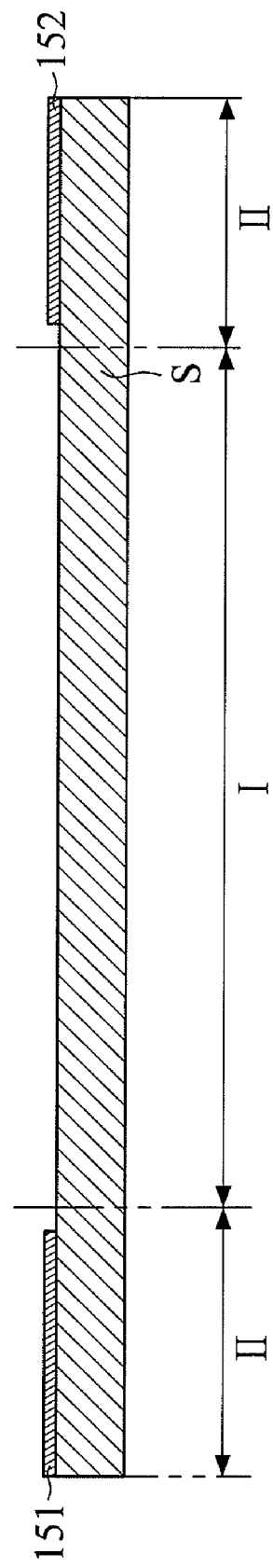

First, as shown in FIG. 7A, etch stopping layers 151 and 152 are formed on a substrate S. The etch stopping layers 151 and 152 prevent the substrate S from being etched during a via hole forming process to be described later with reference to FIG. 7I. Accordingly, the etch stopping layers 151 and 152 are formed on a position determined as the non-actuating area (II). In the case where a laser is used for the via hole forming process, the etch stopping layers 151 and 152 may be formed of material having a high resistance to a laser beam.

Figure 7B:
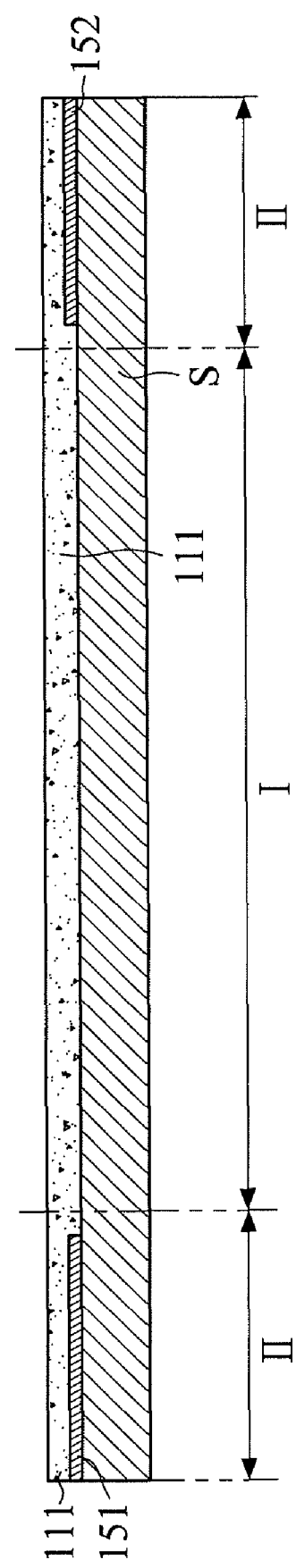

As shown in FIG. 7B, the polymer layer 111 is formed on the substrate S having the etch stopping layers 151 and 152. There are no particular restrictions on the method of forming the first polymer layer 111, and a conventional polymer coating method may be used. The first polymer layer 111 completely covers the etch stopping layers 151 and 152 or may expose the etch stopping layers 151 and 152. The first polymer layer 111 may have a small thickness of about 50 μm or below.

As shown in FIG. 7C, the first driving electrode 121 is formed on the first polymer layer 111. The first driving electrode 121 covers the actuating area (I) and has a portion extending to the left side non-actuating area (II). The first driving electrode 121 may be formed of conductive polymer or metal selected from the group consisting of gold (Au), copper (Cu), titanium (Ti), chromium (Cr), molybdenum (Mo), and aluminum (Al) and aluminum-copper (Al—Cu) alloy. In the case where the first driving electrode 121 is formed of metal, a conventional deposition method such as a sputtering or a Physical Vapor Deposition (PVD) may be used. If the first polymer layer 111 has a thickness of 50 μm or below, the driving electrode 121 may be formed of an aluminum-copper (Al—Cu) alloy.

Figure 7D:
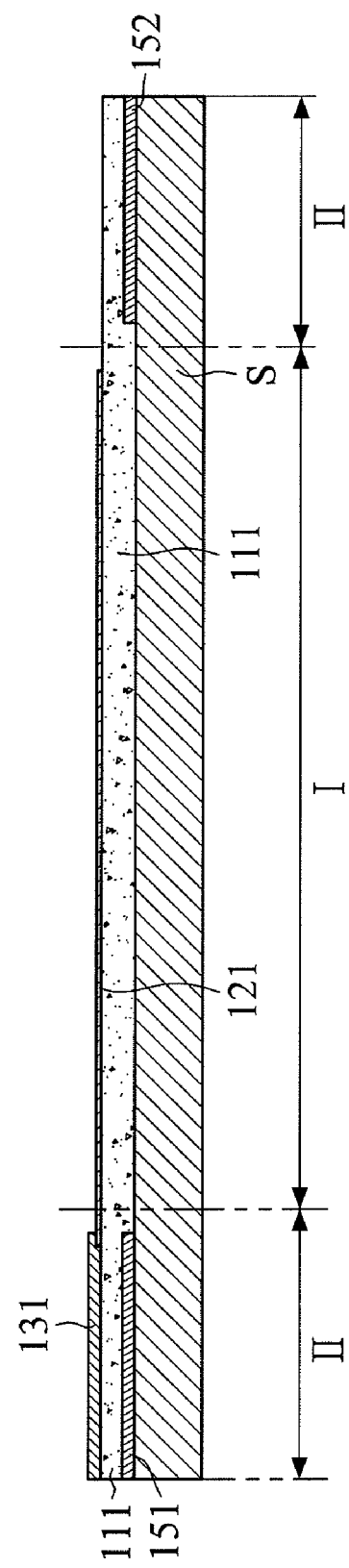

As shown in FIG. 7D, the first extension electrode 131 is formed on the left side non-actuating area (II). The first extension electrode 131 is formed on the first polymer layer 111 and has a portion making contact with the first driving electrode 121, in particular, making contacting with a portion of the first driving electrode extending to the left side non-actuating area (II). The first extending electrode 131 may be formed of material having a low electrical resistance and having a lower reactivity to a laser beam than the polymer. For example, the first extension electrode 131 may be formed of metal selected from the group consisting of gold (Au), copper (Cu), titanium (Ti), chromium (Cr), molybdenum (Mo), and aluminum (Al) and may be provided in a thickness of about 50 to 5000 nm. The first extension electrode 131 may be formed using the same method as that of the first driving electrode 121.

Figure 7E:
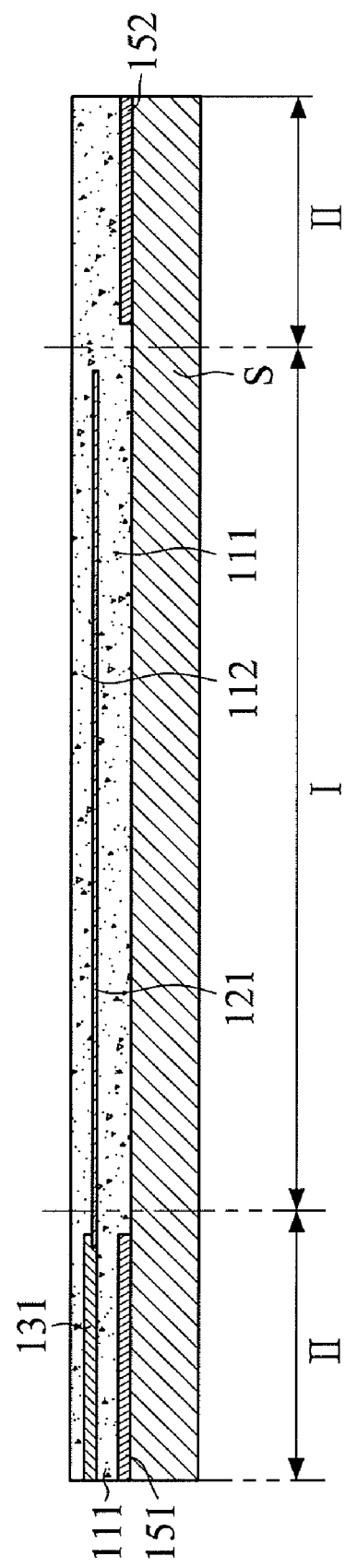
Figure 7H:
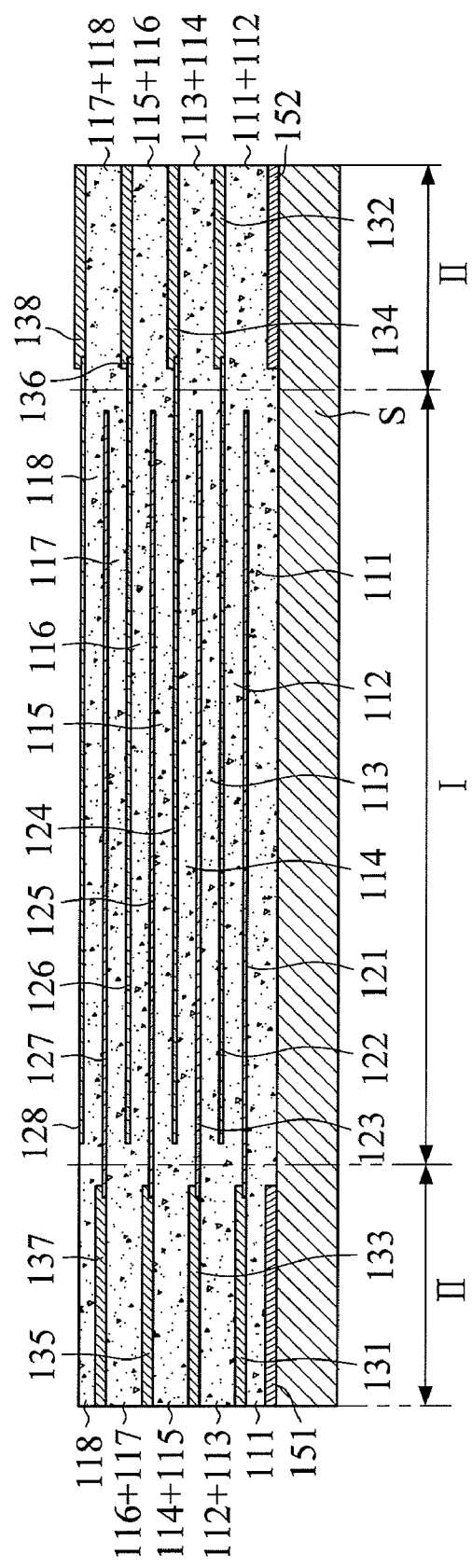

As shown in FIG. 7E, the second polymer 112 is formed on the entire upper surface of the resultant structure of FIG. 7D, that is, the second polymer 112 is formed on an upper surface of a combination of the first polymer layer 111, the first driving electrode 121 and the first extension electrode 131. Since the manufacturing method, the thickness and the material of the second polymer layer 112 are identical to those of the first polymer layer 111, a detailed description thereof will be omitted. As shown in FIG. 7F, a second driving electrode 122 is formed on the second polymer layer 112. The second driving electrode 122 covers the actuating area (I) and has a portion extending to the right side non-actuating area (II). Since the manufacturing method, the material and the thickness of the second driving electrode 122 are identical to those of the first driving electrode 121, a detailed description thereof will be omitted. As shown in FIG. 7G, a second extension electrode 132 is formed on the right side non-actuating area (II). The second extension electrode 132 is formed on the upper surface of the second polymer layer 112 and has a portion making contact with the second driving electrode 122, in particular, making contact with a portion of the second driving electrode 122 extending to the right side non-actuating area (II). Since the manufacturing method, the material and the thickness of the second extension electrode 132 are identical to those of the first extension electrode 131, a detailed description thereof will be omitted.

Referring to FIGS. 7B to 7G, the forming of the polymer layer, the forming of the driving electrode and the forming of the extension electrode are repeated a predetermined number of times, for example, 4 times, thereby forming a stacked structure including polymer layers each of which is provided, at one side thereof, with a driving electrode and an extension electrode.

Figure 7I:
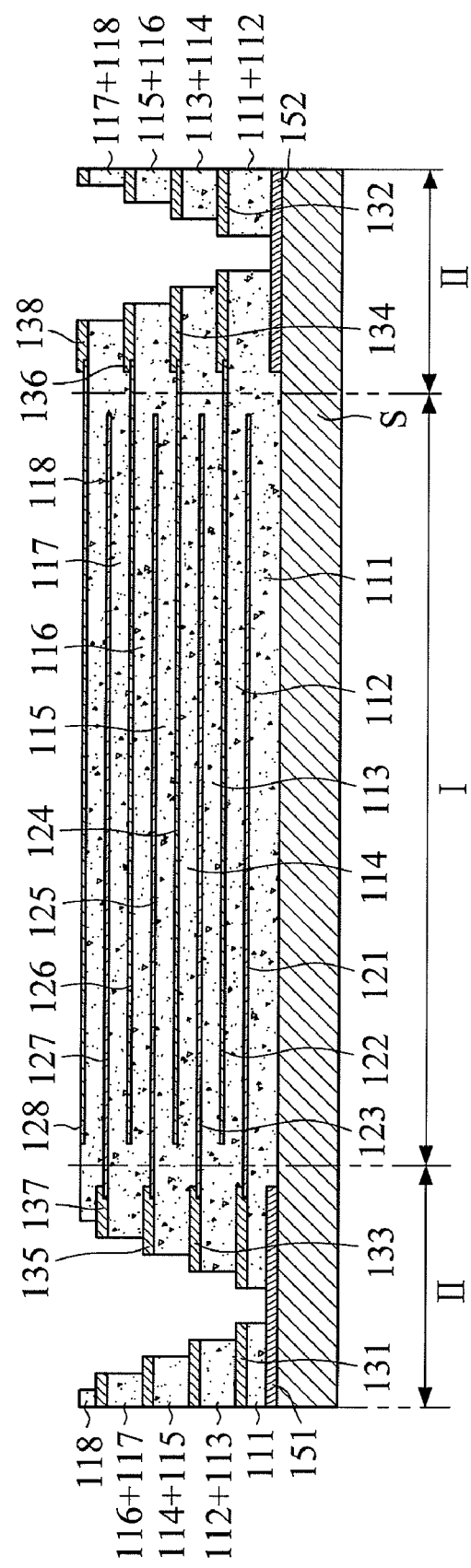

As shown in FIG. 7I, the non-actuating area (II) of the stacked structure, in particular, the extension electrodes 131 to 138 and the polymer layers 111 to 118 corresponding to the middle portion of the extension electrodes 131 to 138 of the non-actuating area (II), are etched, thereby forming via holes $H_1$ and $H_2$. The via holes $H_1$ and $H_2$ are provided in a step shapes having diameters which increase upwards such that some parts of the individual upper surfaces of the extension electrodes 131 to 138 are exposed. According to another example, in order to form a step shape profile, the extension electrodes 131 to 138 and the polymer layers 111 to 118 corresponding to edges of the extension electrodes 131 to 138 may be etched.

The metal forming the extension electrodes 131 to 138 and the polymer forming the polymer layers 111 to 118, such as a ferro-electric polymer and a dielectric elastomer, exhibit differences in physical properties, for example, a modulus of elasticity and a thermal expansion coefficient. If the polymer layers 111 to 118 and the extension electrodes 131 to 138 are physically cut to form a via hole in the non-actuating area (II) of the stacked structure shown in FIG. 7H, the cut portion of the polymer layers 111 to 118 expands and covers the cut portions of the extension electrodes 131 to 138. This is due to heat generated during the cutting process or inherent physical properties of the polymer. If the cut portion of the extension electrodes 131 to 138 is not exposed, the stacked extension electrodes 131 to 138 are not easily connected to each other. In addition, conventional etching technologies such as dry etching or wet etching may damage the polymer layers 111 to 118 and may also cause delamination, and thus it is difficult to apply such a conventional etching technology when forming a via hole.

In order to form the via holes $H_1$ and $H_2$ having diameters which increase upwards, the polymer layers 111 to 118 and the extension electrodes 131 to 138 are etched using a laser that reacts strongly with polymers but less strongly to the metal forming the extension electrodes 131 and 138. The laser may be a carbon dioxide ($CO_2$) laser or a green laser. There are no particular restrictions on the laser used for the etching.

In particular, it is assumed that a laser such as a carbon dioxide laser having a predetermined energy is incident onto the left side non-actuating area (II) of the stacked structure. The laser removes a great amount of an eighth polymer layer 118, which is formed of polymer having a great reactivity with respect to laser, and this process is performed with a small amount of energy consumption. After that, the laser beam passing through the eighth polymer layer 118 reaches a seventh extension electrode 137. However, the seventh extension electrode 137 is formed of metal material having a low reactivity to the laser, so a relatively great amount of energy is required to etch the seventh extension electrode 137 using laser. As a result, the removed portion of the seventh extension electrode 137 is smaller than that of the eighth polymer layer 118 during a laser etching, that is, when viewed in FIG. 3, the width of the removed portion of the seventh extension electrode 137 is narrower than that of the eighth polymer layer 118, and the seventh extension electrode 137 passes a reduced amount of laser downward. Sequentially, in etching a sixth and seventh polymer layer 116+117, additional energy consumption is not required and the width of the removed portion of the sixth and seventh polymer layer 116+117 is almost the same as that of the seventh extension electrode 137.

As described above, a great amount of energy is consumed to etch the extension electrodes 131, 133, 135 and 137 using laser, so the power of energy of the laser is reduced in a downward direction in a stepwise manner or discontinuous manner. As a result, as shown in FIG. 3, the via holes $H_1$ and $H_2$ having a step shape profile are formed in the non-actuating area (II) of the stacked structure, and parts of the extension electrodes 131 to 138 are exposed through the via holes $H_1$ and $H_2$.

As shown in FIG. 7J, the common electrodes 141 and 142 are formed in the via holes $H_1$ and $H_2$ of the non-actuating area (II). The common electrodes 141 and 142 are formed of conductive material such as metal and there are no restrictions on the method of forming the common electrodes 141 and 142. The common electrodes 141 and 142 may be formed to correspond to the profile of the via holes $H_1$ and $H_2$ in a predetermined thickness, for example, 1000 nm or above. Alternatively, the common electrodes 141 and 142 may be formed in a great thickness to entirely fill the via holes $H_1$ and $H_2$. Such common electrodes 141 and 142 have a step shape profile which makes contact with the exposed upper surfaces of the extension electrodes 131 to 138.

According to the interconnection electrode structure of the multilayer EAP actuator and the method of manufacturing the same, the electrical connectivity among the driving electrodes is improved and the manufacturing cost is reduced. In addition, since the polymer layer of the multilayer EAP actuator is provided to be thin, the small driving voltage is reduced and a superior driving performance is ensured for a long period of time.

A number of exemplary embodiments have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. An interconnection electrode structure comprising:
   a plurality of non-actuating layers comprising polymer layers, a first extension electrode and a second extension electrodes disposed at upper surfaces of the polymer layers, and a via hole which penetrates through the plurality of non-actuating layers and comprises a diameter which increases in a stepwise manner upwards; and
   a common electrode having a stepped profile, formed in the via hole to connect the first and the second extension electrodes at the via hole to each other,
   wherein the first and the second extension electrodes are disposed at opposing sides of the via hole.

2. The interconnection electrode structure of claim 1, wherein the common electrode comprises a step shape.

3. The interconnection electrode structure of claim 1, wherein the first and the second extension electrodes comprise a material having a low reactivity to laser that is lower than a reactivity of the polymer layer to the laser.

4. The interconnection electrode structure of claim 3, further comprising an etch stopping layer formed under the non-actuating layers.

5. The interconnection electrode structure of claim 1, wherein one of the first and the second extension electrodes is connected to one of a first group of driving electrodes or one of a second group of driving electrodes of a multilayer electroactive polymer actuator.

6. The interconnection electrode structure of claim 5, wherein each of the first and the second the driving electrodes comprises an aluminum-copper alloy and the first and the second extension electrodes comprise a metal selected from the group consisting of gold (Au), copper (Cu), titanium (Ti), chromium (Cr), molybdenum (Mo), and aluminum (Al).

7. The interconnection electrode structure of claim 1, wherein the via hole is formed through the first and the second extension electrodes.

8. An electroactive polymer actuator comprising:
   a plurality of polymer layers that are stacked on top of each other and are divided into an actuating area and a non-actuating area;
   a plurality of driving electrodes, which are formed on surfaces of the plurality of polymer layers to cover at least the actuating area;
   a first extension electrode and a second extension electrode disposed at upper surfaces of the polymer layers, and a via hole which penetrates through the plurality of non-actuating layers and comprises a diameter which increases in a stepwise manner upwards; and
   a common electrode having a stepped profile, formed in the via hole to connect the first and the second extension electrodes at the via hole to each other,
   wherein the first and the second extension electrodes are disposed at opposing sides of the via hole.

9. The electroactive polymer actuator of claim 8, wherein at least one of the plurality of polymer layers comprises a thickness of about 2.5 to μm or less.

10. The electroactive polymer actuator of claim 8, wherein the non-actuating area comprises a first non-actuating area positioned at a first side of the actuating area, and a second non-actuating positioned at a second side of the actuating area, and
   wherein the plurality of driving electrodes comprises a plurality of first driving electrodes extending from the actuating area to the first-non actuating area, and a plurality of second driving electrodes extending from the actuating area to the second non-actuating area;

wherein the plurality of first driving electrodes are alternately disposed in a vertical direction with the plurality of second driving electrodes.

11. The electroactive polymer actuator of claim 10, further comprising a first interconnection electrode structure configured to connect the plurality of first driving electrodes to each other in the first non-actuating area and a second interconnection electrode structure configured to connect the plurality of second driving electrodes to each other in the second non-actuating area, wherein the first interconnection electrode structure comprises:
  a plurality of non-actuating layers comprising the first and the second extension electrodes connected to the plurality of first driving electrodes extended in the respective non-actuating area, and a via hole which penetrates through the plurality of non-actuating layers and comprises a diameter which increases in a stepwise manner upwards; and
  a common electrode formed in the via hole to connect the first and the second-extension electrodes at the via hole to each other.

12. The electroactive polymer actuator of claim 11, wherein the first and the second extension electrodes comprise a metal selected from the group consisting of gold (Au), copper (Cu), titanium (Ti), chromium (Cr), molybdenum (Mo), and aluminum (Al).

13. The electroactive polymer actuator of claim 11, wherein the first and the second extension electrodes are formed on the non-actuating area in a rectangular shape along an edge of the actuating area.

14. A multilayer electro active polymer actuator comprising:
  a plurality of polymer layers that are stacked on top of each other and are divided into an actuating area, and a first non-actuating area positioned at a first side of the actuating area, and a second non-actuating area positioned at a second side of the actuating area;
  a plurality of driving electrodes formed on surfaces of the plurality of polymer layers to cover at least the actuating area and comprising a plurality of first driving electrodes extending from the actuating area to the first-non actuating area and a plurality of second driving electrodes extending from the actuating area to the second non-actuating area, wherein the plurality of first driving electrodes are alternately disposed in a vertical direction with the plurality of second driving electrodes; and
  a first interconnection electrode structure configured to connect the plurality of first driving electrodes to each other in the first non-actuating area and a second interconnection electrode structure configured to connect the plurality of second driving electrodes to each other in the second non-actuating area,
  wherein the first interconnection electrode structure comprises:
    a plurality of non-actuating layers comprising a plurality of first extension electrodes connected to the plurality of first driving electrodes extended in the first non-actuating area, a plurality of second extension electrodes, and a via hole which penetrates through the plurality of first non-actuating layers and has a diameter which increases in a stepwise manner upwards; and
    a common electrode having a stepped profile, formed in the via hole to connect the plurality of first and the plurality of second extension electrodes at the via hole to each other; and
  wherein the first and the second extension electrodes are disposed at opposing sides of the via hole.

15. The multilayer electroactive polymer actuator of claim 14, wherein the driving electrodes comprise an aluminum-copper alloy and the plurality of first and the second extension electrodes comprise a metal selected from the group consisting of gold (Au), copper (Cu), titanium (Ti), chromium (Cr), molybdenum (Mo), and aluminum (Al).

16. The multilayer electroactive polymer actuator of claim 15, wherein at least one of the plurality of polymer layers comprises a thickness of about 2.5 μm or less.

17. A varifocal fluidic lens comprising the multilayer electroactive polymer actuator of claim 8.

18. The interconnection electrode structure of claim 1, wherein the first and the second extension electrodes have partially exposed upper surfaces.

19. The multilayer electroactive polymer actuator of claim 14, wherein the first and the second extension electrodes have partially exposed upper surfaces.

* * * * *